United States Patent
Han et al.

(10) Patent No.: US 12,243,970 B2
(45) Date of Patent: Mar. 4, 2025

(54) DISPLAY SUBSTRATE AND DISPLAY DEVICE

(71) Applicant: BOE Technology Group Co., Ltd., Beijing (CN)

(72) Inventors: Long Han, Beijing (CN); Pinfan Wang, Beijing (CN); Fangxu Cao, Beijing (CN); Wenqiang Li, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 419 days.

(21) Appl. No.: 17/628,425

(22) PCT Filed: Feb. 3, 2021

(86) PCT No.: PCT/CN2021/074978
§ 371 (c)(1),
(2) Date: Jan. 19, 2022

(87) PCT Pub. No.: WO2022/165657
PCT Pub. Date: Aug. 11, 2022

(65) Prior Publication Data
US 2023/0155088 A1    May 18, 2023

(51) Int. Cl.
*H01L 27/12* (2006.01)
*H01L 27/15* (2006.01)
(Continued)

(52) U.S. Cl.
CPC ............ *H01L 33/62* (2013.01); *H01L 27/124* (2013.01); *H01L 27/1255* (2013.01); *H01L 27/156* (2013.01); *H01L 29/78696* (2013.01)

(58) Field of Classification Search
CPC ... H01L 33/62; H01L 27/124; H01L 27/1255; H01L 27/156; H01L 29/78696
(Continued)

(56) References Cited

U.S. PATENT DOCUMENTS

2006/0105146 A1* 5/2006 Bourdelais .............. G06F 3/045
428/166
2017/0371465 A1   12/2017 Ahn
(Continued)

FOREIGN PATENT DOCUMENTS

CN          111210726 A       5/2020

OTHER PUBLICATIONS

Aug. 31, 2023—(EP)—Extended European Search Report Appn 21923685.8.

*Primary Examiner* — Ori Nadav
(74) *Attorney, Agent, or Firm* — Banner & Witcoff, Ltd.

(57) ABSTRACT

A display substrate and a display device. The display substrate includes: a plurality of pixel islands, a first opening, a second opening and a first passage region. Each pixel island includes at least one pixel, each pixel includes a plurality of first driving lines, the first passage region is provided with a plurality of first connection lines, each of the plurality of pixel islands further includes a plurality of transfer lines, and the plurality of transfer lines are arranged in different layers from the plurality of first driving lines and cross each other to form a plurality of overlapping regions; the plurality of transfer lines are electrically connected with the plurality of first driving lines through via holes located in part of the overlapping regions, and the transfer lines in two adjacent pixel islands are respectively connected with the plurality of first connection lines in the first passage region.

16 Claims, 7 Drawing Sheets

(51) Int. Cl.
*H01L 29/786* (2006.01)
*H01L 33/62* (2010.01)

(58) Field of Classification Search
USPC .......................................... 257/79
See application file for complete search history.

(56) References Cited

U.S. PATENT DOCUMENTS

| | | | |
|---|---|---|---|
| 2020/0210043 A1* | 7/2020 | Yoo .................... | G06F 3/0412 |
| 2020/0312248 A1* | 10/2020 | Shin .................... | G09G 3/3266 |
| 2022/0328604 A1 | 10/2022 | Yang et al. | |

* cited by examiner

DISPLAY SUBSTRATE AND DISPLAY DEVICE

The application is a U.S. National Phase Entry of International Application No. PCT/CN2021/074978 filed on Feb. 3, 2021, designating the United States of America. The present application claims priority to and the benefit of the above-identified application and the above-identified application is incorporated by reference herein in its entirety.

TECHNICAL FIELD

Embodiments of the present disclosure relate to a display substrate and a display device.

BACKGROUND

With the continuous development of display technology, flexible display technology has been widely used in various display devices because of its advantages of low power consumption, small size, portability and various display modes. In order to improve the display quality and use effect, four curved surface screen design is widely used in smart electronic products such as mobile phones and tablet computers. The four curved surface screen design is a design combining with the 3D cover glass bonding technology, and bending the edges or corners of a display substrate according to a certain bending radius to form radians, so as to realize the comprehensive stereoscopic display of the front and the side, thus realizing the 3D stereoscopic effect of four curved surface form, thus creating a sense of stereoscopic immersion, which is in line with the future technological development trend.

SUMMARY

Embodiments of the present disclosure provide a display substrate and a display device. The display substrate includes: a plurality of pixel islands, a first opening, a second opening and a first passage region. The plurality of pixel islands are arranged in an array in a first direction and a second direction; the first opening is located between two pixel islands adjacent in the second direction; the second opening is located between two pixel islands adjacent in the first direction; the first passage region is at least partially located between the first opening and the second opening and connects two pixel islands adjacent in the first direction; each of the plurality of pixel islands overlaps with the first opening in the first direction, each of the plurality of pixel islands includes at least one pixel, each pixel includes a plurality of first driving lines extending in the first direction, the first passage region is provided with a plurality of first connection lines, each of the plurality of pixel islands further includes a plurality of transfer lines extending in the second direction, and the plurality of transfer lines are arranged in different layers from the plurality of first driving lines and cross each other to form a plurality of overlapping regions; the plurality of transfer lines are electrically connected with the plurality of first driving lines through via holes located in part of the overlapping regions, and the transfer lines in two pixel islands adjacent in the first direction are respectively connected with the plurality of first connection lines in the first passage region. The display substrate leads out the plurality of first driving lines in each of the plurality of pixel islands through the plurality of transfer lines, and respectively connects a plurality of first driving lines of two pixel islands adjacent in the first direction through a plurality of first connection lines in the first passage region, thereby realizing the connection of the plurality of first driving lines of two pixel islands adjacent in the first direction. Therefore, the display substrate can realize the wiring of the driving lines in the stretchable region or the bending region with opening patterns.

At least one embodiment of the present disclosure provides a display substrate, which includes: a plurality of pixel islands, arranged in an array in a first direction and a second direction; a first opening, located between two pixel islands adjacent in the second direction; a second opening, located between two pixel islands adjacent in the first direction; and a first passage region, at least partially located between the first opening and the second opening, each of the plurality of pixel islands includes at least one pixel, the pixel includes a plurality of first driving lines extending in the first direction, the first passage region is provided with a plurality of first connection lines, each of the plurality of pixel islands further includes a plurality of transfer lines extending in the second direction, the plurality of transfer lines are arranged in different layers from the plurality of first driving lines and cross each other to form a plurality of overlapping regions; the plurality of transfer lines are electrically connected with the plurality of first driving lines through via holes located in part of the plurality of overlapping regions, the transfer lines in two adjacent ones of the plurality of pixel islands in the first direction are respectively connected with the plurality of first connection lines in the first passage region.

For example, in the display substrate provided by an embodiment of the present disclosure, each of the plurality of pixel islands includes two sub-regions and a transfer region located between the two sub-regions, the at least one pixel included in each of the plurality of pixel islands is arranged in the two sub-regions, and the plurality of transfer lines are located in the transfer region.

For example, in the display substrate provided by an embodiment of the present disclosure, the plurality of first driving lines pass through the two sub-regions and the transfer region, and the plurality of first driving lines are configured to drive the at least one pixel in the two sub-regions to perform light-emitting display.

For example, in the display substrate provided by an embodiment of the present disclosure, the first opening extends in the first direction and the second opening extends in the second direction, the first opening and the second opening are alternately arranged in the first direction, and the first opening and the second opening are also alternately arranged in the second direction.

For example, in the display substrate provided by an embodiment of the present disclosure, the first passage region is located between one of the plurality of pixel islands and the first opening.

For example, in the display substrate provided by an embodiment of the present disclosure, the pixel includes a plurality of sub-pixels, and each of the plurality of sub-pixels includes a pixel driving circuit and an anode electrically connected with the pixel driving circuit.

For example, the display substrate provided by an embodiment of the present disclosure includes: a base substrate; a semiconductor layer, located on the base substrate; a gate insulating layer, located at a side of the semiconductor layer away from the base substrate; a first gate layer, located at a side of the gate insulating layer away from the semiconductor layer; an interlayer insulating layer, located at a side of the first gate layer away from the gate insulating layer; a second gate layer, located at a side of the interlayer insulating layer away from the first gate layer; a passivation layer, located at a side of the second gate layer away from the interlayer insulating layer; and a first conductive layer, located at a side of the passivation layer away from the second gate layer, the plurality of first driving lines are located in at least one of the first gate layer and the second gate layer, and the plurality of transfer lines are located in the first conductive layer.

For example, in the display substrate provided by an embodiment of the present disclosure, the pixel driving circuit includes: a first semiconductor unit, a second semiconductor unit, a third semiconductor unit, a fourth semiconductor unit, a fifth semiconductor unit, a sixth semiconductor unit and a seventh semiconductor unit located in the semiconductor layer; a first electrode block, located in the first gate layer; and a second electrode block, located in the second gate layer, the first semiconductor unit includes a first channel region and a first source region and a first drain region on two sides of the first channel region, the second semiconductor unit includes a second channel region and a second source region and a second drain region on two sides of the second channel region, the third semiconductor unit includes a third channel region and a third source region and a third drain region on two sides of the third channel region, the fourth semiconductor unit includes a fourth channel region and a fourth source region and a fourth drain region on two sides of the fourth channel region, the fifth semiconductor unit includes a fifth channel region and a fifth source region and a fifth drain region on two sides of the fifth channel region, the sixth semiconductor unit includes a sixth channel region and a sixth source region and a sixth drain region on two sides of the sixth channel region, the seventh semiconductor unit includes a seventh channel region and a seventh source region and a seventh drain region on two sides of the seventh channel region, the third source region, the first drain region and the fifth source region are connected to a first node, the sixth drain region is connected to the third drain region, the first source region, the second drain region and the fourth drain region are connected to a second node, the fifth drain region is connected to the seventh drain region, an orthographic projection of the second electrode block on the base substrate at least partially overlaps with an orthographic projection of the first electrode block on the base substrate to form a storage capacitor.

For example, in the display substrate provided by an embodiment of the present disclosure, the plurality of first driving lines include: an initialization signal line, located in the second gate layer; a reset signal line, located in the first gate layer; a gate line, located in the first gate layer; and a light-emitting control line, located in the first gate layer, the initialization signal line is connected with the seventh source region and the sixth source region, the reset signal line overlaps with the seventh channel region and the sixth channel region, the gate line respectively overlaps with the third channel region and the second channel region, the first electrode block overlaps with the first channel region, and the light-emitting control line overlaps with the fourth channel region and the fifth channel region.

For example, in the display substrate provided by an embodiment of the present disclosure, each of the plurality of pixel islands includes at least two pixels arranged in the second direction, and at least two of the plurality of first driving lines are connected with a same one of the plurality of transfer lines.

For example, in the display substrate provided by an embodiment of the present disclosure, each of the plurality of pixel islands includes four pixels arranged in a matrix, each of the plurality of pixel islands includes a first sub-region, a second sub-region and a transfer region located between the first sub-region and the second sub-region, the first sub-region includes a first pixel and a second pixel arranged in the second direction, the second sub-region includes a third pixel and a fourth pixel arranged in the second direction, the initialization signal line of the first pixel and the initialization signal line of the third pixel are a first initialization signal line, and the initialization signal line of the second pixel and the initialization signal line of the fourth pixel are a second initialization signal line, the plurality of transfer lines include a first transfer line, the first initialization signal line of the first pixel and the third pixel is electrically connected with the first transfer line through a via hole, and the second initialization signal line of the second pixel and the fourth pixel is electrically connected with the first transfer line through a via hole.

For example, in the display substrate provided by an embodiment of the present disclosure, the reset signal line of the first pixel and the reset signal line of the third pixel are a first reset signal line, the reset signal line of the second pixel and the reset signal line of the fourth pixel are a second reset signal line, the plurality of transfer lines include a second transfer line and a third transfer line, the first reset signal line of the first pixel and the third pixel is electrically connected with the second transfer line through a via hole, and the second reset signal line of the second pixel and the fourth pixel is electrically connected with the third transfer line through a via hole.

For example, in the display substrate provided by an embodiment of the present disclosure, the gate line of the first pixel and the gate line of the third pixel are a first gate line, the gate line of the second pixel and the gate line of the fourth pixel are a second gate line, the plurality of transfer lines include a fourth transfer line, the first gate line of the first pixel and the third pixel is electrically connected with the third transfer line through a via hole, and the second gate line of the second pixel and the fourth pixel is electrically connected with the fourth transfer line through a via hole.

For example, in the display substrate provided by an embodiment of the present disclosure, the light-emitting control line of the first pixel and the light-emitting control line of the third pixel are a first light-emitting control line, and the light-emitting control line of the second pixel and the light-emitting control line of the fourth pixel are a second light-emitting control line, the plurality of transfer lines include a fifth transfer line, the first light-emitting control line of the first pixel and the third pixel is electrically connected with the fifth transfer line through a via hole, and the second light-emitting control line of the second pixel and the fourth pixel is electrically connected with the fifth transfer line through a via hole.

For example, in the display substrate provided by an embodiment of the present disclosure, the light-emitting control line of the first pixel and the light-emitting control line of the third pixel are a first light-emitting control line, and the light-emitting control line of the second pixel and the light-emitting control line of the fourth pixel are a second light-emitting control line, the plurality of transfer lines include a fifth transfer line and a sixth transfer line, the first light-emitting control line of the first pixel and the third pixel is electrically connected with the fifth transfer line through a via hole, and the second light-emitting control line of the second pixel and the fourth pixel is respectively connected with the sixth transfer line through a via hole.

For example, in the display substrate provided by an embodiment of the present disclosure, the plurality of first connection lines are arranged in the first gate layer and the second gate layer.

For example, in the display substrate provided by an embodiment of the present disclosure, a number of the plurality of transfer lines is smaller than a number of the plurality of first driving lines.

For example, the display substrate provided by an embodiment of the present disclosure further includes: a second passage region, each of the plurality of pixel islands includes a plurality of second driving lines extending in the second direction, and the second passage region is provided with a plurality of second connection lines, the plurality of second connection lines respectively connect the second driving lines of two adjacent ones of the plurality of pixel islands in the second direction.

For example, in the display substrate provided by an embodiment of the present disclosure, the plurality of second driving lines include: a plurality of power lines located in the first conductive layer, each of the plurality of power lines is connected with the fourth source region in the pixel driving circuit; and a plurality of data lines located in the first conductive layer, each of the plurality of data lines being connected with the second source region in the pixel driving circuit.

For example, the display substrate provided by an embodiment of the present disclosure further includes: an insulating layer, located at a side of the first conductive layer away from the passivation layer; and a second conductive layer, located at a side of the insulating layer away from the first conductive layer, the second conductive layer includes a conductive grid located on the plurality of pixel islands, and the conductive grid is electrically connected with the plurality of power lines in each of the plurality of pixel islands, the plurality of second connection lines include a power connection line, located in the second conductive layer and connected with the conductive grid.

For example, in the display substrate provided by an embodiment of the present disclosure, the plurality of second connection lines further include a plurality of data connection lines, and the plurality of data lines are arranged and connected in one-to-one correspondence with the plurality of data connection lines.

For example, in the display substrate provided by an embodiment of the present disclosure, the plurality of second connection lines are arranged in the first conductive layer and the second conductive layer.

For example, in the display substrate provided by an embodiment of the present disclosure, the pixel includes a first color sub-pixel, a second color sub-pixel and a third color sub-pixel, each of the plurality of pixel islands includes four pixels arranged in a matrix, each of the plurality of pixel islands includes a first sub-region, a second sub-region and a transfer region between the first sub-region and the second sub-region, the first sub-region includes a first pixel and a second pixel arranged in the second direction, and the second sub-region includes a third pixel and a fourth pixel arranged in the second direction, the data line of the first color sub-pixel in the first pixel and the data line of the first color sub-pixel in the second pixel are a first data line, the data line of the second color sub-pixel in the first pixel and the data line of the second color sub-pixel in the second pixel are a second data line, the data line of the third color sub-pixel in the first pixel and the data line of the third color sub-pixel in the second pixel are a third data line, the data line of the first color sub-pixel in the third pixel and the data line of the first color sub-pixel in the fourth pixel are a fourth data line, the data line of the second color sub-pixel in the third pixel and the data line of the second color sub-pixel in the fourth pixel are a fifth data line, the data line of the third color sub-pixel in the third pixel and the data line of the third color sub-pixel in the fourth pixel are a sixth data line, the plurality of second connection lines include a first data connection line, a second data connection line, a third data connection line, a fourth data connection line, a fifth data connection line and a sixth data connection line, the first data connection line is connected with the first data line, the second data connection line is connected with the second data line, the third data connection line is connected with the third data line, the fourth data connection line is connected with the fourth data line, the fifth data connection line is connected with the fifth data line, and the sixth data connection line is connected with the sixth data line.

For example, in the display substrate provided by an embodiment of the present disclosure, the first data connection line, the second data connection line and the fifth data connection line are located in the first conductive layer, and the power connection line, the third data connection line, the fourth data connection line and the sixth data connection line are located in the second conductive layer.

For example, in the display substrate provided by an embodiment of the present disclosure, the display substrate includes a first display region and a second display region, a pixels per inch (PPI) of the first display region is greater than a PPI of the second display region, and the plurality of pixel islands are located in the second display region.

For example, in the display substrate provided by an embodiment of the present disclosure, the second display region is located at a corner of the first display region.

For example, in the display substrate provided by an embodiment of the present disclosure, the second display region of the display substrate is bendable in a direction perpendicular to the first display region.

At least one embodiment of the present disclosure further provides a display device, including any one of the above-mentioned display substrate.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Generally, by reducing the pixels per inch (PPI) of four corner regions of a display substrate and setting a stretchable structure with opening patterns in these four corner regions, the edges or corners of the display substrate can be bent according to a certain bending radius, thus realizing the four curved surface screen design. At this time, the greater the stretching amount of the stretchable structure located in the four corner regions, the lower the PPI of these four corner regions, which is a low PPI region. On the other hand, because these four corner regions are provided with opening patterns, these opening patterns divide the pixel array into isolated pixel islands; the driving lines (such as gate lines, data lines, etc.) of pixels in these pixel islands need to be connected with each other, but these driving lines cannot directly cross these opening patterns, so the control lines and data lines of pixel units need to be routed bypass the opening patterns.

In this regard, embodiments of the present disclosure provide a display substrate and a display device. The display substrate includes: a plurality of pixel islands, a first opening, a second opening and a first passage region. The plurality of pixel islands are arranged in an array in a first direction and a second direction; the first opening is located between two pixel islands adjacent in the second direction; the second opening is located between two pixel islands adjacent in the first direction; the first passage region is at least partially located between the first opening and the second opening and connects two pixel islands adjacent in the first direction; each of the plurality of pixel islands overlaps with the first opening in the first direction, each of the plurality of pixel islands includes at least one pixel, each pixel includes a plurality of first driving lines extending in the first direction, the first passage region is provided with a plurality of first connection lines, each of the plurality of pixel islands further includes a plurality of transfer lines extending in the second direction, and the plurality of transfer lines are arranged in different layers from the plurality of first driving lines and cross each other to form a plurality of overlapping regions; the plurality of transfer lines are electrically connected with the plurality of first driving lines through via holes located in part of the overlapping regions, and the transfer lines in two pixel islands adjacent in the first direction are respectively connected with the plurality of first connection lines in the first passage region. The display substrate leads out the plurality of first driving lines in each of the plurality of pixel islands through the plurality of transfer lines, and respectively connects a plurality of first driving lines of two pixel islands adjacent in the first direction through a plurality of first connection lines in the first passage region, thereby realizing the connection of the plurality of first driving lines of two pixel islands adjacent in the first direction. Therefore, the display substrate can realize the wiring of the driving lines in the stretchable region or the bending region with opening patterns.

Hereinafter, the display substrate and the display device provided by the embodiments of the present disclosure will be described in detail with reference to the drawings.

Figure 1:
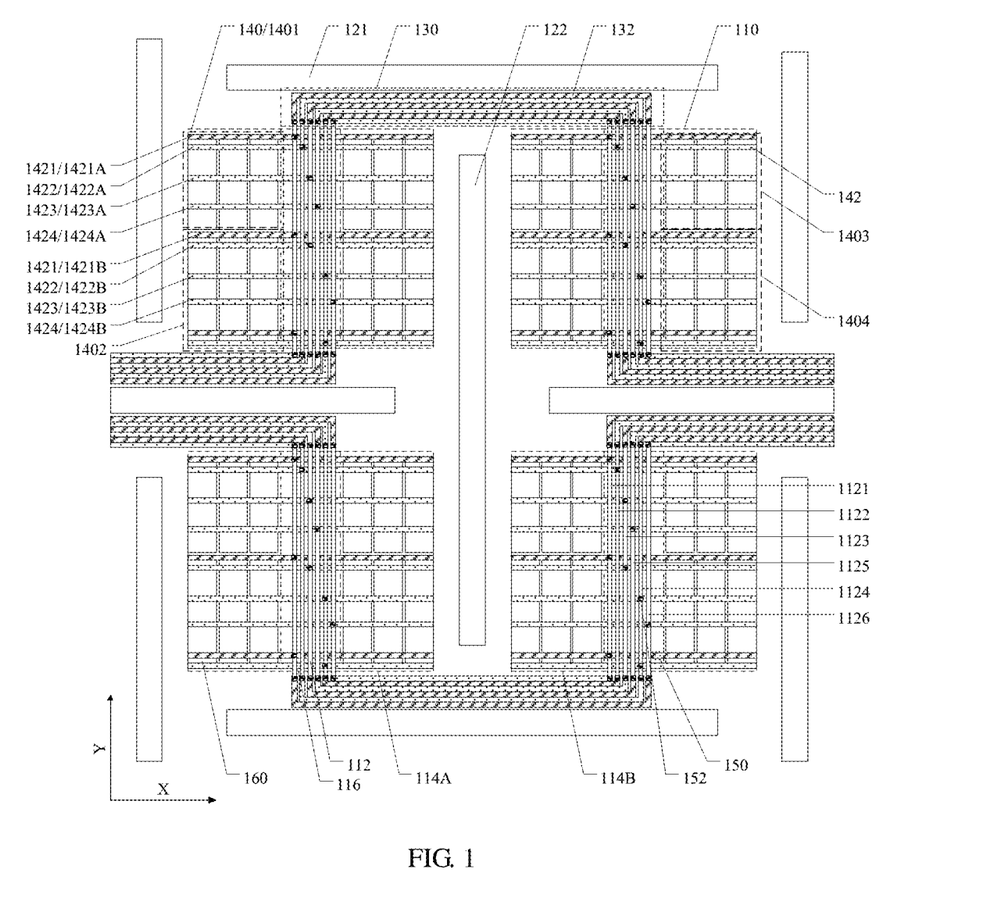
FIG. 1 is a schematic plan view of a display substrate according to an embodiment of the present disclosure.

An embodiment of the present disclosure provides a display substrate. FIG. 1 is a schematic plan view of a display substrate according to an embodiment of the present disclosure. As illustrated in FIG. 1, the display substrate 100 includes a plurality of pixel islands 110, a first opening 121, a second opening 122 and a first passage region 130. The plurality of pixel islands 110 are arranged in an array in a first direction and a second direction. The distance between pixel islands 110 is large, for example, the distance between adjacent pixel islands 110 is greater than the distance between adjacent pixels 140 in pixel islands 110. The first opening 121 is located between two pixel islands 110 adjacent in the second direction; the second opening 122 is located between two pixel islands 110 adjacent in the first direction; the first passage region 130 is at least partially located between the first opening 121 and the second opening 122 and connects two pixel islands 110 adjacent in the first direction. Each of the plurality of pixel islands 110 overlaps with the first opening 121 in the first direction, that is, an orthographic projection of the pixel island on a reference line extending in the first direction overlaps with an orthographic projection of the first opening on the reference line.

Each of the plurality of pixel islands 110 includes at least one pixel 140, each pixel 140 includes a plurality of first driving lines 142 extending in the first direction, the first passage region 130 is provided with a plurality of first connection lines 132, and each of the plurality of pixel islands 110 further includes a plurality of transfer lines 112 extending in the second direction, the plurality of transfer lines are arranged in different layers from the plurality of first driving lines 142 and cross each other to form a plurality of overlapping regions 150. The plurality of transfer lines 112 are electrically connected with the plurality of first driving lines 142 through the via holes 152 located in part of the overlapping region 150, and the transfer lines 112 in two pixel islands 110 adjacent in the first direction are respectively connected with the plurality of first connection lines 132 in the first passage region 130. It should be noted that in the display substrate, the first driving line can be a gate line, which is located in one of a first gate layer and a second gate layer; at this time, the above-mentioned transfer line can be located in other conductive layers, such as the other of the first gate layer and the second gate layer, a first source-drain metal layer, a second source-drain metal layer, or a light shielding layer. In addition, the above-mentioned via holes have different depths according to the difference of the plurality of first driving lines and the plurality of transfer lines connected by the via holes, and adjacent via holes are arranged in a staggered way to avoid mutual interference. In the display substrate provided by the embodiment of the present disclosure, in each of the plurality of pixel islands 110, the plurality of first driving lines 142 of each pixel 140 can be led out through the transfer lines 112, and then the transfer lines 112 of two pixel islands 110 adjacent in the first direction are respectively connected with the plurality of first connection lines 132 in the first passage region 130, thereby connecting the plurality of first driving lines 142 of two pixel islands 110 adjacent in the first direction. Therefore, the display substrate can realize the wiring of the driving lines in the stretchable region or the bending region with opening patterns. In addition, by fully utilizing the first passage region between the first opening and the second opening, the display substrate can ensure that the first opening and the second opening have larger sizes, thereby improving the stretching or bending performance of the display substrate.

In some examples, as illustrated in FIG. 1, each of the plurality of pixel islands 110 includes two sub-regions 114 and a transfer region 116 located between the two sub-regions 114, the at least one pixel 140 included in the pixel island 110 is arranged in the two sub-regions 114, and the transfer lines 112 are located in the transfer region 116. Therefore, the display substrate places the above-mentioned transfer lines 112 by setting the transfer region 116 in the pixel island 110, and setting the transfer region 116 between the two sub-regions 114, so that the distribution symmetry of the pixels 140 in the pixel island 110 can be improved.

In some examples, as illustrated in FIG. 1, a plurality of first driving lines 142 pass through the two sub-regions 114 and the transfer region 116, and the plurality of first driving lines 142 are configured to drive the at least one pixel 140 in the two sub-regions 114 for light-emitting display. It should be noted that one of the two sub-regions can be a dummy region, that is, a region that is not for displaying.

For example, the above-mentioned first driving lines 142 can include driving lines extending in the first direction, such as gate lines, light-emitting control lines, and initialization lines.

In some examples, as illustrated in FIG. 1, the first openings 121 extend in the first direction and the second openings 122 extend in the second direction. The first openings 121 and the second openings 122 are alternately arranged in the first direction and also alternately arranged in the second direction. Therefore, in the region where the first openings and the second openings are located, the display substrate can be better bent or folded, which is convenient to realize the design of the four curved surface screen.

In some examples, as illustrated in FIG. 1, the first passage region 130 is located between the pixel island 110 and the first opening 121, and between the first opening 121 and the end of the second opening 122 close to the first opening 121. Therefore, the first passage region 130 can bypass the first opening 121 and the second opening 122, and realize efficient use of the space on the display substrate.

In some examples, as illustrated in FIG. 1, the first opening 121 overlaps with both of the two pixel islands 110 adjacent in the first direction. Therefore, the distribution area of the first opening is large, which is beneficial to the bending of the display substrate.

In some examples, as illustrated in FIG. 1, an orthographic projection of the second opening 122 on the first opening 121 is located in the middle of the first opening 121. Therefore, the distribution of the second opening and the first opening of the display substrate has high symmetry, so that the display substrate can be flexibly bent.

In some examples, as illustrated in FIG. 1, each pixel 140 includes a plurality of sub-pixels 160, and each sub-pixel 160 includes a pixel driving circuit 162 and an anode 164 electrically connected to the pixel driving circuit 162.

Figure 2:
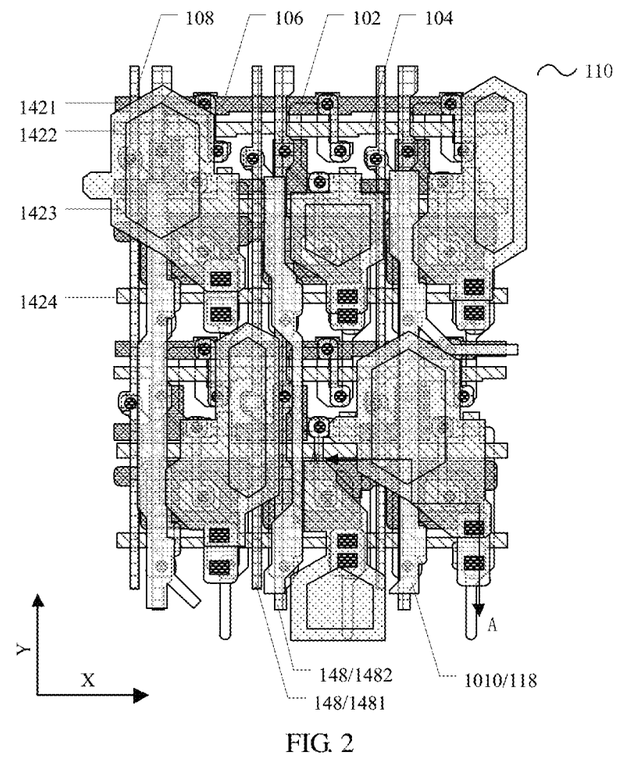
FIG. 2 is a schematic plan view of a pixel in a display substrate according to an embodiment of the present disclosure.
Figure 3:
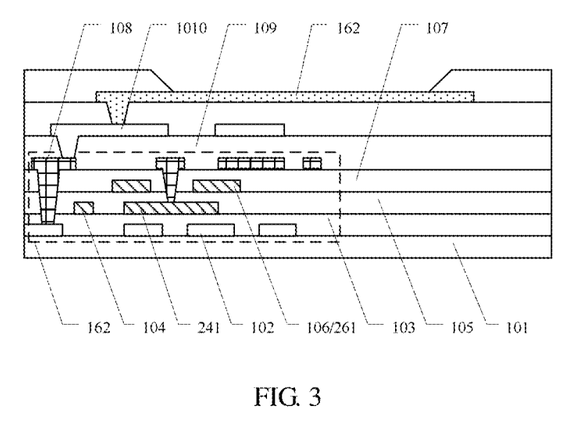
FIG. 3 is a schematic section view of a display substrate along AA direction in FIG. 2 according to an embodiment of the present disclosure.

FIG. 2 is a schematic plan view of a pixel in a display substrate according to an embodiment of the present disclosure. FIG. 3 is a schematic section view of a display substrate along the AA direction in FIG. 2 according to an embodiment of the present disclosure. As illustrated in FIGS. 2 and 3, the display substrate 100 includes a base substrate 101, a semiconductor layer 102, a gate insulating layer 103, a first gate layer 104, an interlayer insulating layer 105, a second gate layer 106, a passivation layer 107 and a first conductive layer 108. The semiconductor layer 102 is located on the base substrate 101; the gate insulating layer 103 is located at the side of the semiconductor layer 102 away from the base substrate 101. The first gate layer 104 is located at the side of the gate insulating layer 103 away from the semiconductor layer 102. The interlayer insulating layer 105 is located at the side of the first gate layer 104 away from the gate insulating layer 103. The second gate layer 106 is located at the side of the interlayer insulating layer 105 away from the first gate layer 104. The passivation layer 107 is located at the side of the second gate layer 106 away from the interlayer insulating layer 105. The first conductive layer 108 is located at the side of the passivation layer 104 away from the second gate layer 106. The above-mentioned plurality of first driving lines 142 are located in at least one of the first gate layer 104 and the second gate layer 106, and the above-mentioned transfer line 112 is located in the first conductive layer 108. Therefore, by arranging the transfer line 112 on the first conductive layer 108, on the one hand, the existing conductive layer in the display substrate can be utilized, and on the other hand, the transfer line 112 can be arranged in a different layer from the first driving line, which is convenient for forming the above-mentioned overlapping region 150, thus enabling flexible connection.

In some examples, as illustrated in FIGS. 2 and 3, the display substrate 100 further includes an insulating layer 109 and a second conductive layer 1010. The insulating layer 109 is located at the side of the first conductive layer 108 away from the passivation layer 107. The second conductive layer 1010 is located at the side of the insulating layer 109 away from the first conductive layer 108. The second conductive layer 1010 includes a conductive grid 118 located on the pixel island 110, and the conductive grid 118 is electrically connected with a plurality of power lines in the pixel island 110.

Figure 4A:
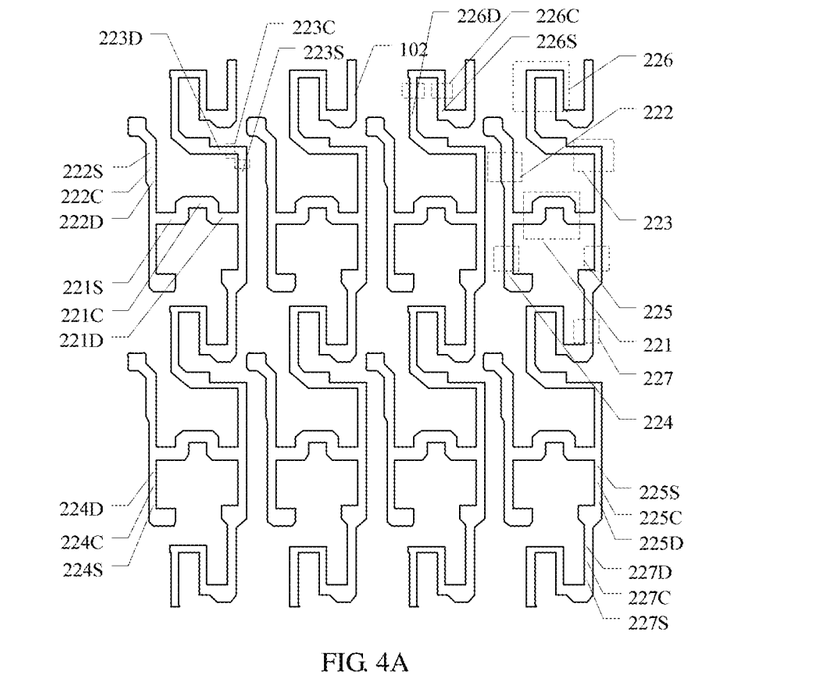
FIGS. 4A-4D are schematic diagrams of a plurality of film layers of a pixel driving circuit in a display substrate according to an embodiment of the present disclosure.

FIGS. 4A-4D are schematic diagrams of a plurality of film layers of a pixel driving circuit in a display substrate according to an embodiment of the present disclosure; FIG. 5 is an equivalent schematic diagram of a pixel driving circuit in a display substrate according to an embodiment of the present disclosure. As illustrated in FIGS. 4A and 5, each pixel driving circuit 162 includes: a first semiconductor unit 221, a second semiconductor unit 222, a third semiconductor unit 223, a fourth semiconductor unit 224, a fifth semiconductor unit 225, a sixth semiconductor unit 226 and a seventh semiconductor unit 227 located in the semiconductor layer 102; a first electrode block 241 located in the first gate layer 104; and a second electrode block 261 located in the second gate layer 106. The first semiconductor unit 221 includes a first channel region 221C and a first source region 221S and a first drain region 221D located at two sides of the first channel region 221C. The second semiconductor unit 222 includes a second channel region 222C and a second source region 222S and a second drain region 222D on two sides of the second channel region 222C. The third semiconductor unit 223 includes a third channel region 223C and a third source region 223S and a third drain region 223D on two sides of the third channel region 223C. The fourth semiconductor unit 224 includes a fourth channel region 224C and a fourth source region 224S and a fourth drain region 224D on two sides of the fourth channel region 224C. The fifth semiconductor unit 225 includes a fifth channel region 225C and a fifth source region 225S and a fifth drain region 225D on two sides of the fifth channel region 225C. The sixth semiconductor unit 226 includes a sixth channel region 226C and a sixth source region 226S and a sixth drain region 226D on two sides of the sixth channel region 226C. The seventh semiconductor unit 227 includes a seventh channel region 227C and a seventh source region 227S and a seventh drain region 227D on two sides of the seventh channel region 227C.

As illustrated in FIGS. 4A and 5, the third source region 223S, the first drain region 221D and the fifth source region 225S are connected to a first node N1, the sixth drain region 226D is connected to the third drain region 223D, and the first source region 221S, the second drain region 222D and the fourth drain region 224D are connected to a second node N2, the fifth drain region 225D is connected to the seventh drain region 227D. The orthographic projection of the second electrode block 261 on the base substrate 101 at least partially overlaps with the orthographic projection of the first electrode block 241 on the base substrate 101 to form a storage capacitor Cst.

Figure 4B:
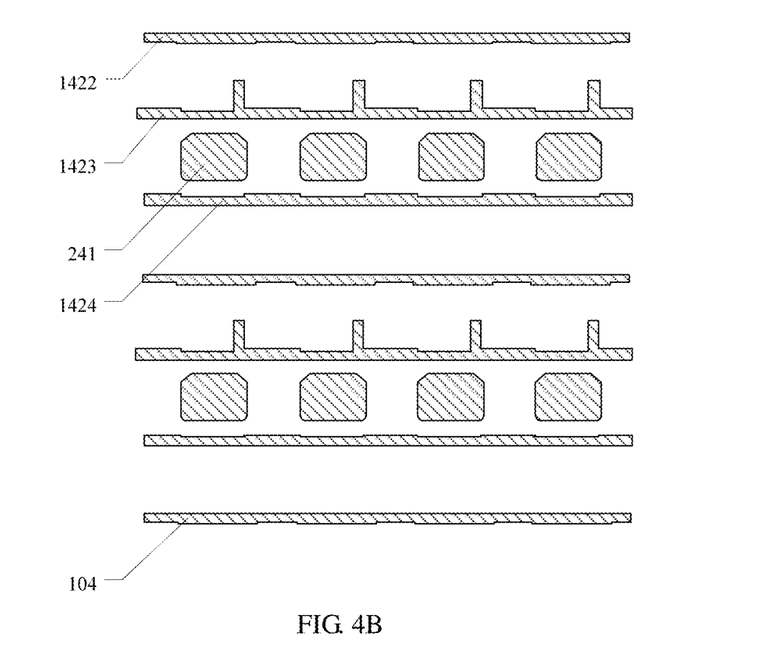
Figure 4C:
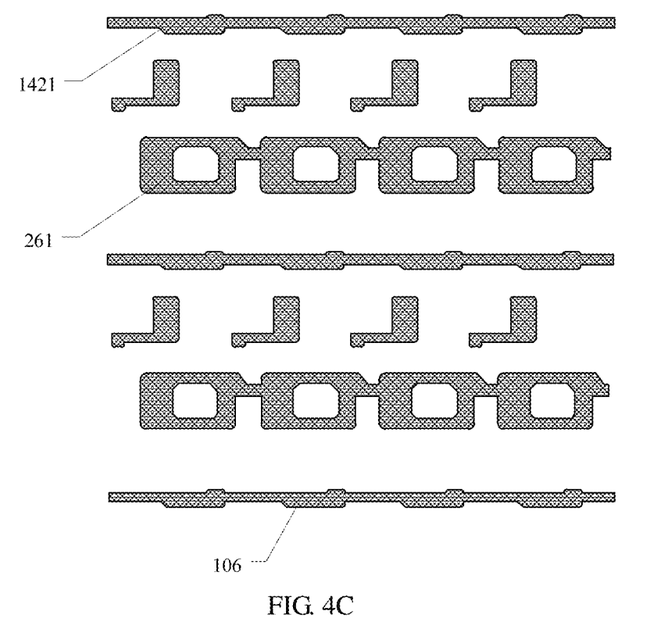
Figure 5:
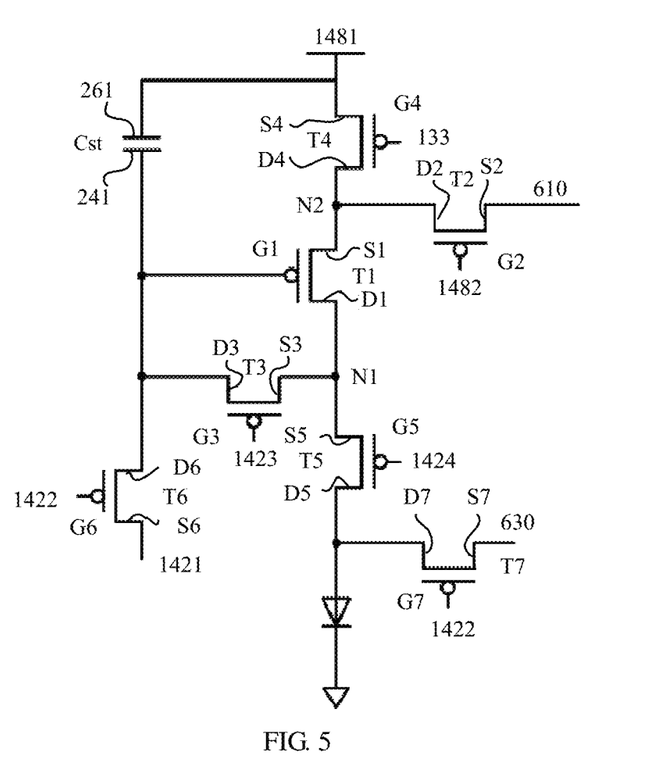
FIG. 5 is an equivalent schematic diagram of a pixel driving circuit in a display substrate according to an embodiment of the present disclosure.

As illustrated in FIG. 4B, FIG. 4C and FIG. 5, the plurality of first driving lines 142 include: an initialization signal line 1421 located in the second gate layer 106; a reset signal line 1422 located in the first gate layer 104; a gate line 1423 located in the first gate layer 104; and a light-emitting control line 1424 located in the first gate layer 104. The initialization signal line 1421 is connected with the seventh source region 227S and the sixth source region 226S, the reset signal line 1422 overlaps with the seventh channel region 217C and the sixth channel region 226C to form the seventh thin film transistor T7 and the sixth thin film transistor T6 with the seventh semiconductor unit 227 and the sixth semiconductor unit 226, the gate line 1423 respectively overlaps with the third channel region 223C and the second channel region 222C to form the third thin film transistor T3 and the second thin film transistor T2 with the third semiconductor unit 223 and the second semiconductor unit 222. The first electrode block 241 overlaps the first channel region 221C to form a first thin film transistor T1 with the first semiconductor unit 221, and the light-emitting control line 1424 overlaps the fourth channel region 224C and the fifth channel region 225C to form a fourth thin film transistor T4 and a fifth thin film transistor with the fourth semiconductor unit 224 and the fifth semiconductor unit 225.

Figure 4D:
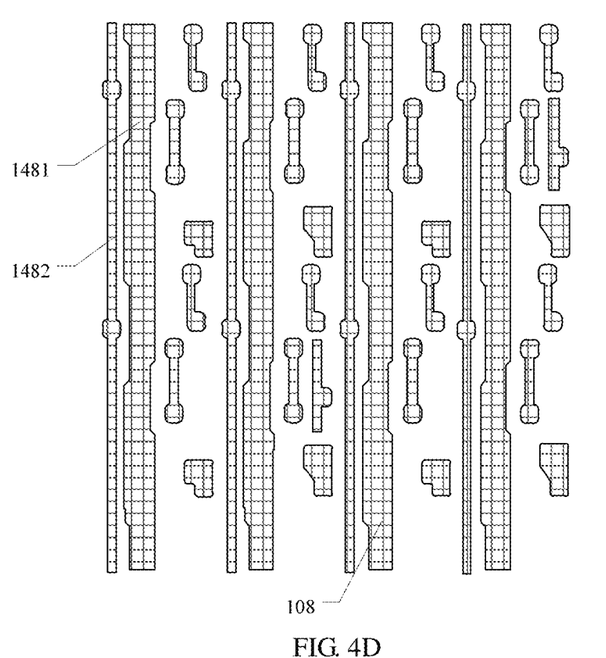

As illustrated in FIGS. 4D and 5, the display substrate 100 further includes a plurality of second driving lines 148. The plurality of second driving lines 148 include: a plurality of power lines 1481 located in the first conductive layer 108, and each power line 1481 is connected with the fourth source region 224S in the pixel driving circuit 162; and a plurality of data lines 1482 located in the first conductive layer 108, and each data line 1482 is connected with the second source region 222S in the pixel driving circuit 162.

In some examples, as illustrated in FIG. 1, the number of the plurality of transfer lines 112 is smaller than the number of the plurality of first driving lines 142. Therefore, the number of the transfer lines 112 can be reduced, the area occupied by the plurality of transfer lines 112 can be reduced, and the PPI can be improved.

In some examples, as illustrated in FIG. 1, each of the plurality of pixel islands 110 includes at least two pixels 140 arranged in the second direction, and at least two of the plurality of first driving lines 142 are connected to the same transfer line 112. Therefore, the number of transfer lines 112 can be reduced, so that the area occupied by the plurality of transfer lines 112 can be reduced, the PPI can be improved, and the first opening and the second opening can be further ensured to have larger sizes, so that the stretching or bending performance of the display substrate can be further improved.

In some examples, as illustrated in FIG. 1, each of the plurality of pixel islands 110 includes four pixels 140 arranged in a matrix. Each of the plurality of pixel islands 110 includes a first sub-region 114A, a second sub-region 114B and a transfer region 116 between the first sub-region 114A and the second sub-region 114B. The first sub-region 114A includes a first pixel 1401 and a second pixel 1402 arranged in the second direction, and the second sub-region 114B includes a third pixel 1403 and a fourth pixel 1404. The initialization signal line 1421 of the first pixel 1401 and the initialization signal line 1421 of the third pixel 1403 are a first initialization signal line 1421A, and the initialization signal line 1421 of the second pixel 1402 and the initialization signal line 1421 of the fourth pixel 1404 are a second initialization signal line 1421B. The plurality of transfer lines 112 include a first transfer line, the first initialization signal line 1421A of the first pixel 1401 and the third pixel 1403 are electrically connected to the first transfer line 1121 through a via hole 152, and the second initialization signal line 1421B of the second pixel 1402 and the fourth pixel 1404 are electrically connected to the first transfer line 1121 through the via hole 152. Therefore, the display substrate can lead out the initialization signal lines of four pixels through only one transfer line, thereby reducing the number of transfer lines, reducing the area occupied by plurality of transfer lines and improving the PPI.

In some examples, as illustrated in FIG. 1, the reset signal line 1422 of the first pixel 1401 and the reset signal line 1422 of the third pixel 1403 are a first reset signal line 1422A, and the reset signal line 1422 of the second pixel 1402 and the reset signal line 1422 of the fourth pixel 1404 are a second reset signal line 1422B. The plurality of transfer lines include a second transfer line 1122 and a third transfer line 1123, the first reset signal line 1422A of the first pixel 1401 and the third pixel 1403 are electrically connected to the second transfer line 1122 through the via hole 152, and the second reset signal line 1422B of the second pixel 1402 and the fourth pixel 1404 are electrically connected to the third transfer line 1123 through the via hole. Therefore, the display substrate can lead out the reset signal lines of four pixels only through two transfer lines, thereby further reducing the number of transfer lines, reducing the area occupied by the plurality of transfer lines and improving the PPI.

In some examples, as illustrated in FIG. 1, the gate line 1423 of the first pixel 1401 and the gate line 1423 of the third pixel 1403 are a first gate line 1423A, and the gate line 1423 of the second pixel 1402 and the gate line 1423 of the fourth pixel 1404 are a second gate line 1423B. The plurality of transfer lines 112 include a fourth transfer line 1124, the first gate line 1423A of the first pixel 1401 and the third pixel 1403 are electrically connected to the third transfer line 1123 through the via hole 152, and the second gate line 1423B of the second pixel 1402 and the fourth pixel 1404 are electrically connected to the fourth transfer line 1124 through the via hole 152. Therefore, the display substrate can lead out the gate lines of four pixels only by adding one transfer line, thereby further reducing the number of transfer lines, reducing the area occupied by the plurality of transfer lines and improving the PPI.

In some examples, as illustrated in FIG. 1, the light-emitting control line 1424 of the first pixel 1401 and the light-emitting control line 1424 of the third pixel 1403 are a first light-emitting control line 1424A, the light-emitting control line 1424 of the second pixel 1402 and the light-emitting control line 1424 of the fourth pixel 1404 are a second light-emitting control line 1424B. The plurality of transfer lines 112 include a fifth transfer line 1125 and a sixth transfer line 1126, the first light-emitting control line 1424A of the first pixel 1401 and the third pixel 1403 are electrically connected to the fifth transfer line 1125 through the via hole 152, and the second light-emitting control line 1424B of the second pixel 1402 and the fourth pixel 1404 are electrically connected to the sixth transfer line 1126 through the via hole 152. Therefore, the display substrate can lead out the light-emitting control lines of four pixels only by adding two transfer lines, thereby further reducing the number of transfer lines, reducing the area occupied by the plurality of transfer lines and improving the PPI.

Figure 6:
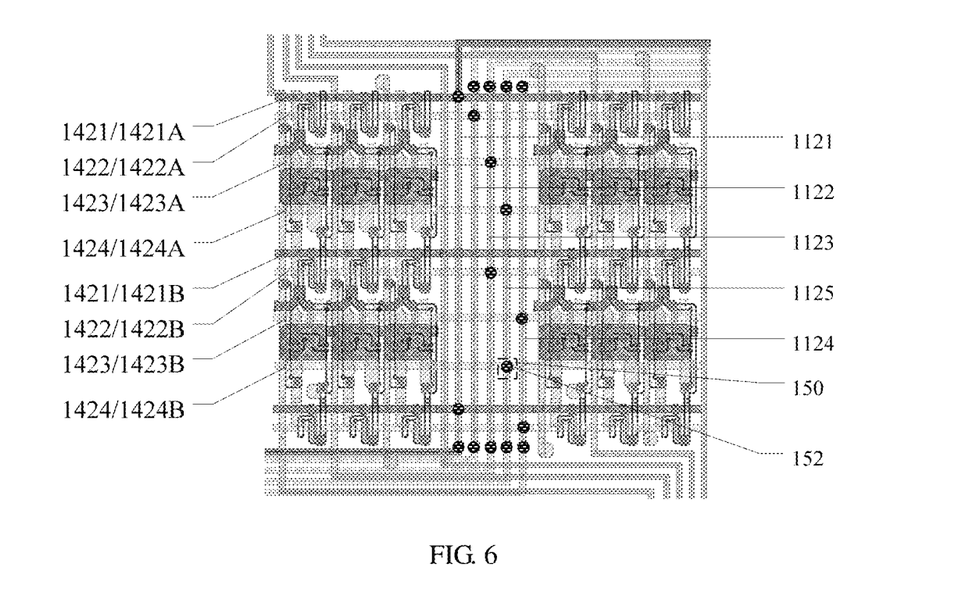
FIG. 6 is a schematic plan view of another display substrate according to an embodiment of the present disclosure.

FIG. 6 is a schematic plan view of another display substrate according to an embodiment of the present disclosure. As illustrated in FIG. 6, the light-emitting control line 1424 of the first pixel 1401 and the light-emitting control line 1424 of the third pixel 1403 are first light-emitting control line 1424A, the light-emitting control line 1424 of the second pixel 1402 and the light-emitting control line 1424 of the fourth pixel 1404 are a second light-emitting control line 1424B. The plurality of transfer lines 112 include a fifth transfer line 1125, the first light-emitting control line 1424A of the first pixel 1401 and the third pixel 1403 are electrically connected to the fifth transfer line 1125 through the via hole 152, and the second light-emitting control line 1424B of the second pixel 1402 and the fourth pixel 1404 are electrically connected to the fifth transfer line 1125 through the via hole 152. Therefore, the display substrate can lead out the light-emitting control lines of four pixels only by adding one transfer line, thereby further reducing the number of transfer lines, reducing the area occupied by the plurality of transfer lines and improving the PPI.

It should be noted that the embodiments illustrated in FIG. 1 and FIG. 6 only illustrate the case where one pixel island 110 includes four pixels 140 arranged in a matrix, but the embodiments of the present disclosure include but are not limited to this. The display substrate can connect different first driving lines with the same or time-sharing signals through a transfer line, thereby reducing the number of transfer lines.

In some examples, as illustrated in FIG. 1, the plurality of first connection lines 132 are arranged in the first gate layer 104 and the second gate layer 106. For example, the plurality of first connection lines 132 are alternately arranged in the first gate layer 104 and the second gate layer 106. At this time, the distance between the orthographic projections of adjacent first connection lines 132 on the base substrate 101 can be set smaller, that is, the plurality of first connection lines can be set more densely, so that the width of the first passage region can be reduced or the number of first connection lines in the first passage region can be increased.

In some examples, as illustrated in FIG. 1, the number of the plurality of transfer lines 112 is the same as the number of the plurality of first connection lines 132, and the plurality of transfer lines 112 are arranged in one-to-one correspondence with the plurality of first connection lines 132. Therefore, the display substrate can connect the transfer lines in two pixel islands adjacent in the first direction through the first connection lines, thereby connecting a plurality of first driving lines in two pixel islands adjacent in the first direction.

Figure 7:
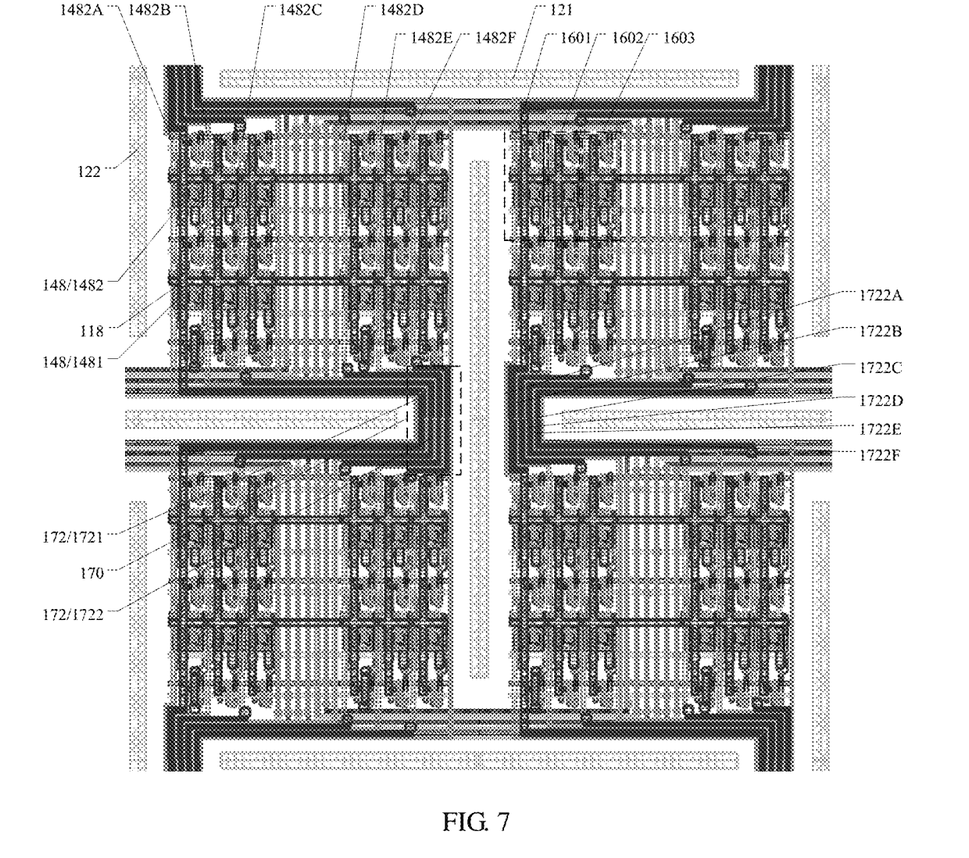
FIG. 7 is a schematic plan view of a display substrate according to an embodiment of the present disclosure.

FIG. 7 is a schematic plan view of a display substrate according to an embodiment of the present disclosure. As illustrated in FIG. 7, the display substrate 100 further includes: a second passage region 170, located between the first opening 121 and the second opening 122 and connecting two pixel islands 110 adjacent in the second direction. Each of the plurality of pixel islands 110 includes a plurality of second driving lines 148 extending in the second direction, and the second passage region 170 is provided with a plurality of second connection lines 172, the plurality of second connection lines 172 respectively connect the second driving lines 148 of two pixel islands 110 adjacent in the second direction.

In some examples, as illustrated in FIG. 2, FIG. 3 and FIG. 7, the plurality of second driving lines 148 include: a plurality of power lines 1481, located in the first conductive layer 108, each power line 1481 being connected with the fourth source region 224S in the pixel driving circuit 162; and a plurality of data lines 1482, located in the first conductive layer 108, and each data line 1482 being connected with the second source region 222S in the pixel driving circuit 162.

In some examples, as illustrated in FIGS. 2, 3 and 7, the display substrate 100 further includes an insulating layer 109 and a second conductive layer 1010. The insulating layer 109 is located at the side of the first conductive layer 108 away from the passivation layer 107. The second conductive layer 1010 is located at the side of the insulating layer 109 away from the first conductive layer 108. The second conductive layer 1010 includes a conductive grid 118 located on the pixel island 110, and the conductive grid 118 is electrically connected with the plurality of power lines 1481 in the pixel island 110.

At this time, as illustrated in FIG. 7, the plurality of second connection lines 172 include a power connection line 1721, located in the second conductive layer 1010 and connected with the conductive grid 118. Because the conductive grid 118 is electrically connected with the plurality of power lines 1481 in the pixel island 110, the power lines 1481 of all pixels 140 in two pixel islands 110 adjacent in the second direction can be connected by only one second connection line 172.

Figure 8:
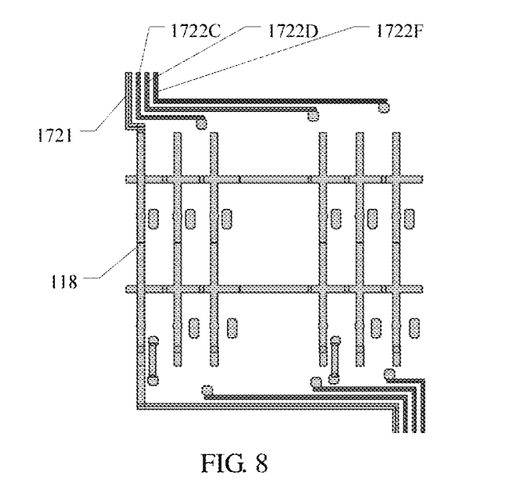
FIG. 8 is a schematic diagram of a second conductive layer in a display substrate according to an embodiment of the present disclosure.

FIG. 8 is a schematic diagram of a second conductive layer in a display substrate according to an embodiment of the present disclosure. As illustrated in FIG. 8, the power connection line 1721 is located in the second conductive layer 1010 and connected with the conductive grid 118. Because the conductive grid 118 is electrically connected with the plurality of power lines 1481 in the pixel island 110, the power lines 1481 of all pixels 140 in the two pixel islands 110 adjacent in the second direction can be connected by only one second connection line 172.

In some examples, as illustrated in FIG. 7, the plurality of second connection lines 172 further include a plurality of data connection lines 1722, the plurality of data connection lines 1722 are arranged and connected with the plurality of data lines 1482 in one-to-one correspondence. Therefore, the display substrate can connect the data lines 1482 of all the pixels 140 in the two pixel islands 110 adjacent in the second direction through the plurality of data connection lines.

In some examples, as illustrated in FIG. 7, the plurality of second connection lines 172 are arranged in the first conductive layer 108 and the second conductive layer 1010. For example, the plurality of second connection lines 172 are alternately arranged in the first conductive layer 108 and the second conductive layer 1010. At this time, the distance between the orthographic projections of adjacent second connection lines 172 on the base substrate 101 can be set smaller, that is, the plurality of second connection lines can be set more densely, so that the width of the second passage region can be reduced or the number of second connection lines in the second passage region can be increased.

In some examples, as illustrated in FIG. 7, each pixel 140 includes a first color sub-pixel 1601, a second color sub-pixel 1602 and a third color sub-pixel 1603, each of the plurality of pixel islands 110 includes four pixels 140 arranged in a matrix, and each of the plurality of pixel islands 140 includes a first sub-region 144A, a second sub-region 144B and a transfer region 146 located between the first sub-region 144A and the second sub-region 144B. The first sub-region 144A includes a first pixel 1401 and a second pixel 1402 arranged in the second direction, and the second sub-region 144B includes a third pixel 1403 and a fourth pixel 1404 arranged in the second direction. The data line 1482 of the first color sub-pixel 1601 in the first pixel 1401 and the data line 1482 of the first color sub-pixel 1401 in the second pixel 1402 are a first data line 1482A, the data line 1482 of the second color sub-pixel 1602 in the first pixel 1401 and the data line 1482 of the second color sub-pixel 1602 in the second pixel 1402 are a second data line 1482B, the data line 1482 of the third color sub-pixel 1603 in the first pixel 1401 and the data line 1482 of the third color sub-pixel 1603 in the second pixel 1402 are a third data line 1482C, and the data line 1482 of the first color sub-pixel 1601 in the third pixel 1403 and the data line 1482 of the first color sub-pixel 1601 in the fourth pixel 1404 are a fourth data line 1482D, the data line 1482 of the second color sub-pixel 1602 in the third pixel 1403 and the data line 1482 of the second color sub-pixel 1602 in the fourth pixel 1404 are a fifth data line 1482E, the data line 1482 of the third color sub-pixel 1603 in the third pixel 1403 and the data line 1482 of the third color sub-pixel 1603 in the fourth pixel 1404 are sixth data lines 1482F. It should be noted that 144A, 144B, 146, 1401, 1402, 1403 and 1404 are not illustrated in FIG. 7 for clarity. The division of the first sub-region 144A, the second sub-region 144B, the transfer region 146, the first pixel 1401, the second pixel 1402, the third pixel 1403 and the fourth pixel 1404 can be seen in FIG. 1.

As illustrated in FIGS. 7 and 8, the plurality of second connection lines 172 include a first data connection line 1722A, a second data connection line 1722B, a third data connection line 1722C, a fourth data connection line 1722D, a fifth data connection line 1722E and a sixth data connection line 1722F. The first data connection line 1722A is connected with the first data line 1482A, the second data connection line 1722B is connected with the second data line 1482B, the third data connection line 1722C is connected with the third data line 1482C, the fourth data connection line 1722D is connected with the fourth data line 1482D, the fifth data connection line 1722E is connected with the fifth data line 1284E, and the sixth data connection line 1722F is connected with the sixth data line 1482F. Therefore, the display substrate can connect the data lines of sub-pixels located in the same column in two pixel islands adjacent in the second direction through the same data connection line.

In some examples, as illustrated in FIGS. 7 and 8, the first data connection line 1722A, the second data connection line 1722B and the fifth data connection line 1722E are located in the first conductive layer 108; the power connection line 1721, the third data connection line 1722C, the fourth data connection line 1722D and the sixth data connection line 1722F are located in the second conductive layer 1010. Therefore, the distance between the orthographic projections of the first data connection line 1722A, the second data connection line 1722B, the third data connection line 1722C, the fourth data connection line 1722D, the fifth data connection line 1722E, the sixth data connection line 1722F and the power connection line 1721 on the base substrate 101 can be set smaller, that is, these second connection lines can be set more densely, thereby reducing the width of the second passage region or increasing the number of the second connection lines in the second passage region.

Figure 9:
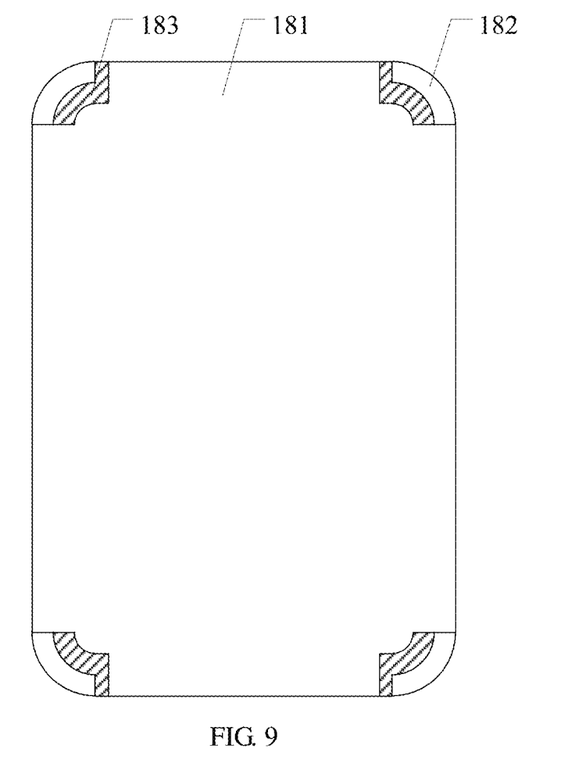
FIG. 9 is a schematic plan view of a display substrate according to an embodiment of the present disclosure.

FIG. 9 is a schematic plan view of a display substrate according to an embodiment of the present disclosure. As illustrated in FIG. 9, the display substrate 100 includes a first display region 181 and a second display region 182. The PPI of the first display region 181 is greater than the PPI of the second display region 182, and the pixel island 110 is located in the second display region 182.

It should be noted that because the PPI of the first display region 181 is greater than the PPI of the second display region 182, there are more pixels in the first display region 181, and these pixels can be connected with the corresponding driving circuits through the third connection lines. At this time, the third connection lines can also be routed through the first passage region, the second passage region and the transfer region.

In some examples, the display substrate 100 further includes a transfer region 183 located between the first display region 181 and the second display region 182. The PPI of the transfer region 183 is smaller than the PPI of the first display region 181, but the PPI of the transfer region 183 can be greater than or equal to the PPI of the second display region 182. The transfer region 183 is not provided with the above-mentioned opening, and can be provided with a row driving circuit for driving the pixels of the display substrate 100 to perform light-emitting display. In some examples, as illustrated in FIG. 9, the second display region 182 is located at the corner of the first display region 181. For example, the planar shape of the display substrate 100 is approximately a rounded rectangle, and the second display region 182 is located at four corner regions of the display substrate 100, that is, the above-mentioned second display region 182 can be bent, so that the four curved surface screen design can be realized.

In some examples, as illustrated in FIG. 9, the planar shape of the first display region 181 includes a first rectangle and two second rectangles located at two sides of the first rectangle in the second direction, and the planar shape of the second display region includes four sectors located at two sides of the two second rectangles in the first direction.

In some examples, the second display region 182 of the display substrate 100 is bendable in a direction perpendicular to the first display region 181. For example, the display substrate 100 includes a light-emitting side, that is, the side where the light emitted from the display substrate 100 exits, and the portion of the display substrate 100 located in the second display region 182 can be bent to the side opposite to the light-emitting side, thereby realizing a curved 3D stereoscopic effect, thereby creating a stereoscopic immersion feeling.

Figure 10:
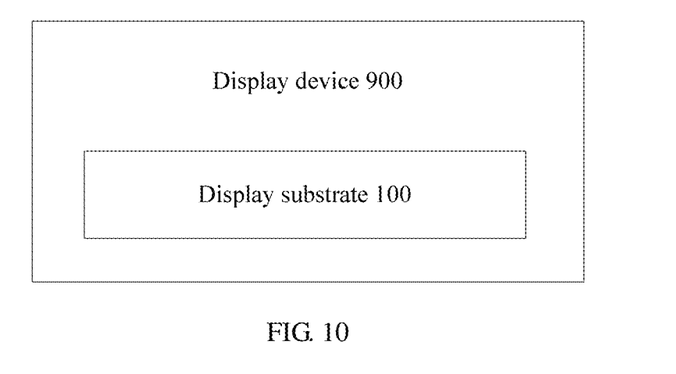
FIG. 10 is a schematic diagram of a display device according to an embodiment of the present disclosure.

An embodiment of the present disclosure further provides a display device. FIG. 10 is a schematic diagram of a display device according to an embodiment of the present disclosure. As illustrated in FIG. 10, the display device 900 includes the display substrate 100 described above. Because the display substrate 100 can realize the wiring of the driving lines in the stretchable or bent regions with opening patterns, the display device 900 including the display substrate 100 can also realize the wiring of the driving lines in the stretchable or bent regions with opening patterns, thus realizing a four curved surface screen design while having a narrow frame width.

For example, the above-mentioned display device can be an electronic product with display function such as a television, a mobile phone, a computer, a navigator, and an electronic picture frame, etc.

It is to be noted that:
(1) The accompanying drawings involve only the structure(s) in connection with the embodiment(s) of the present disclosure, and other structure(s) can be referred to common design(s).
(2) In case of no conflict, features in one embodiment or in different embodiments of the present disclosure can be combined.

What have been described above are only specific implementations of the present disclosure, the protection scope of the present disclosure is not limited thereto, and easily conceivable changes or substitutions should be covered within the protection scope of the present disclosure. Therefore, the protection scope of the present disclosure should be based on the protection scope of the claims.

The invention claimed is:

1. A display substrate, comprising:
a plurality of pixel islands, arranged in an array in a first direction and a second direction;
a first opening, located between two pixel islands adjacent in the second direction;
a second opening, located between two pixel islands adjacent in the first direction; and
a first passage region, at least partially located between the first opening and the second opening,
wherein the display substrate is bendable in regions where the first opening and the second opening are located, each of the plurality of pixel islands comprises at least one pixel, the pixel comprises a plurality of first driving lines extending in the first direction, the first passage region is provided with a plurality of first connection lines,
each of the plurality of pixel islands further comprises a plurality of transfer lines extending in the second direction, the plurality of transfer lines are arranged in different layers from the plurality of first driving lines, the plurality of transfer lines and the plurality of first driving lines cross each other to form a plurality of overlapping regions, the plurality of transfer lines are electrically connected with the plurality of first driving lines through via holes located in part of the plurality of overlapping regions,
the transfer lines in two adjacent ones of the plurality of pixel islands in the first direction are respectively connected with the plurality of first connection lines in the first passage region,
the pixel comprises a plurality of sub-pixels, and each of the plurality of sub-pixels comprises a pixel driving circuit and an anode electrically connected with the pixel driving circuit,
wherein the display substrate further comprises:
a base substrate;
a semiconductor layer, located on the base substrate;
a gate insulating layer, located at a side of the semiconductor layer away from the base substrate;
a first gate layer, located at a side of the gate insulating layer away from the semiconductor layer;
an interlayer insulating layer, located at a side of the first gate layer away from the gate insulating layer;
a second gate layer, located at a side of the interlayer insulating layer away from the first gate layer;
a passivation layer, located at a side of the second gate layer away from the interlayer insulating layer; and
a first conductive layer, located at a side of the passivation layer away from the second gate layer,
wherein the plurality of first driving lines are located in at least one of the first gate layer and the second gate layer, and the plurality of transfer lines are located in the first conductive layer,
wherein the pixel driving circuit comprises:
a first semiconductor unit, a second semiconductor unit, a third semiconductor unit, a fourth semiconductor unit, a fifth semiconductor unit, a sixth semiconductor unit and a seventh semiconductor unit located in the semiconductor layer;
a first electrode block, located in the first gate layer; and
a second electrode block, located in the second gate layer,
wherein the first semiconductor unit comprises a first channel region and a first source region and a first drain region on two sides of the first channel region, the second semiconductor unit comprises a second channel region and a second source region and a second drain region on two sides of the second channel region, the third semiconductor unit comprises a third channel region and a third source region and a third drain region on two sides of the third channel region, the fourth semiconductor unit comprises a fourth channel region and a fourth source region and a fourth drain region on two sides of the fourth channel region, the fifth semiconductor unit comprises a fifth channel region and a fifth source region and a fifth drain region on two sides of the fifth channel region, the sixth semiconductor unit comprises a sixth channel region and a sixth source region and a sixth drain region on two sides of the sixth channel region, the seventh semiconductor unit comprises a seventh channel region and a seventh source region and a seventh drain region on two sides of the seventh channel region,
the third source region, the first drain region and the fifth source region are connected to a first node, the sixth drain region is connected to the third drain region, the first source region, the second drain region and the fourth drain region are connected to a second node, the fifth drain region is connected to the seventh drain region, an orthographic projection of the second electrode block on the base substrate at least partially overlaps with an orthographic projection of the first electrode block on the base substrate to form a storage capacitor.

2. The display substrate according to claim 1, wherein each of the plurality of pixel islands comprises two sub-regions and a transfer region located between the two sub-regions, the at least one pixel comprised in each of the plurality of pixel islands is arranged in the two sub-regions, and the plurality of transfer lines are located in the transfer region.

3. The display substrate according to claim 2, wherein the plurality of first driving lines pass through the two sub-regions and the transfer region, and the plurality of first driving lines are configured to drive the at least one pixel in the two sub-regions to perform light-emitting display.

4. The display substrate according to claim 1, wherein the first opening extends in the first direction and the second opening extends in the second direction, the first opening and the second opening are alternately arranged in the first direction, and the first opening and the second opening are also alternately arranged in the second direction, the first passage region is located between one of the plurality of pixel islands and the first opening.

5. The display substrate according to claim 1, wherein the plurality of first driving lines comprise:
an initialization signal line, located in the second gate layer;
a reset signal line, located in the first gate layer;
a gate line, located in the first gate layer; and
a light-emitting control line, located in the first gate layer,
wherein the initialization signal line is connected with the seventh source region and the sixth source region, the reset signal line overlaps with the seventh channel region and the sixth channel region, the gate line respectively overlaps with the third channel region and the second channel region, the first electrode block overlaps with the first channel region, and the light-emitting control line overlaps with the fourth channel region and the fifth channel region.

6. The display substrate according to claim 5, wherein each of the plurality of pixel islands comprises four pixels arranged in a matrix, each of the plurality of pixel islands comprises a first sub-region, a second sub-region and a transfer region located between the first sub-region and the second sub-region, the first sub-region comprises a first pixel and a second pixel arranged in the second direction, the second sub-region comprises a third pixel and a fourth pixel arranged in the second direction,
an initialization signal line of the first pixel and an initialization signal line of the third pixel are a first initialization signal line, and an initialization signal line of the second pixel and an initialization signal line of the fourth pixel are a second initialization signal line,
the plurality of transfer lines comprise a first transfer line, the first initialization signal line of the first pixel and the third pixel is electrically connected with the first transfer line through a via hole, and the second initialization signal line of the second pixel and the fourth pixel is electrically connected with the first transfer line through a via hole.

7. The display substrate according to claim 6, wherein a reset signal line of the first pixel and a reset signal line of the third pixel are a first reset signal line, a reset signal line of the second pixel and a reset signal line of the fourth pixel are a second reset signal line,
the plurality of transfer lines comprise a second transfer line and a third transfer line, the first reset signal line of the first pixel and the third pixel is electrically connected with the second transfer line through a via hole, and the second reset signal line of the second pixel and the fourth pixel is electrically connected with the third transfer line through a via hole.

8. The display substrate according to claim 7, wherein a gate line of the first pixel and a gate line of the third pixel are a first gate line, a gate line of the second pixel and a gate line of the fourth pixel are a second gate line,
the plurality of transfer lines comprise a fourth transfer line, the first gate line of the first pixel and the third pixel is electrically connected with the third transfer line through a via hole, and the second gate line of the second pixel and the fourth pixel is electrically connected with the fourth transfer line through a via hole.

9. The display substrate according to claim 8, wherein a light-emitting control line of the first pixel and a light-emitting control line of the third pixel are a first light-emitting control line, and a light-emitting control line of the second pixel and a light-emitting control line of the fourth pixel are a second light-emitting control line,
the plurality of transfer lines comprise a fifth transfer line, the first light-emitting control line of the first pixel and the third pixel is electrically connected with the fifth transfer line through a via hole, and the second light-emitting control line of the second pixel and the fourth pixel is electrically connected with the fifth transfer line through a via hole.

10. The display substrate according to claim 8, wherein a light-emitting control line of the first pixel and a light-emitting control line of the third pixel are a first light-emitting control line, and a light-emitting control line of the second pixel and a light-emitting control line of the fourth pixel are a second light-emitting control line,
the plurality of transfer lines comprise a fifth transfer line and a sixth transfer line, the first light-emitting control line of the first pixel and the third pixel is electrically connected with the fifth transfer line through a via hole, and the second light-emitting control line of the second pixel and the fourth pixel is respectively connected with the sixth transfer line through a via hole.

11. The display substrate according to claim 5, wherein the plurality of first connection lines are arranged in the first gate layer and the second gate layer.

12. The display substrate according to claim 1,
wherein each of the plurality of pixel islands comprises a plurality of second driving lines extending in the second direction.

13. The display substrate according to claim 12, wherein the plurality of second driving lines comprise:
a plurality of power lines located in the first conductive layer, each of the plurality of power lines is connected with the fourth source region in the pixel driving circuit; and
a plurality of data lines located in the first conductive layer, each of the plurality of data lines being connected with the second source region in the pixel driving circuit.

14. The display substrate according to claim 13, further comprising:
an insulating layer, located at a side of the first conductive layer away from the passivation layer; and a second conductive layer, located at a side of the insulating layer away from the first conductive layer,
wherein the second conductive layer comprises a conductive grid located on the plurality of pixel islands, and the conductive grid is electrically connected with the plurality of power lines in each of the plurality of pixel islands.

15. The display substrate according to claim 1, wherein the display substrate comprises a first display region and a second display region, a pixels per inch (PPI) of the first display region is greater than a PPI of the second display region, and the plurality of pixel islands are located in the second display region, the second display region of the display substrate is bendable in a direction perpendicular to the first display region.

16. A display device comprising the display substrate according to claim 1.

\* \* \* \* \*